United States Patent [19]
Kouno et al.

[11] Patent Number: 5,233,291
[45] Date of Patent: Aug. 3, 1993

[54] METHOD OF AND APPARATUS FOR MEASURING ELECTRIC CHARACTERISTICS OF SEMICONDUCTOR WAFER

[75] Inventors: Motohiro Kouno; Ikuyoshi Nakatani; Takamasa Sakai, all of Kyoto, Japan

[73] Assignee: Dainippon Screen Mfg. Co., Ltd., Japan

[21] Appl. No.: 764,493

[22] Filed: Sep. 20, 1991

[30] Foreign Application Priority Data

Sep. 22, 1990 [JP] Japan .................. 2-253917

[51] Int. Cl.⁵ .................................. G01R 31/00
[52] U.S. Cl. ............................ 324/158 R; 324/96; 324/158 D; 324/73.1
[58] Field of Search ............ 324/158 D, 73.1, 158 D, 324/662, 689; 250/306, 307, 561, 211, 423 F, 492.2; 356/373, 400; 437/8

[56] References Cited

U.S. PATENT DOCUMENTS

| | | | |
|---|---|---|---|
| 4,083,254 | 4/1978 | Nissl | 73/517 R |
| 4,322,979 | 4/1982 | Fromm | 73/705 |
| 4,681,451 | 7/1987 | Guerra et al. | 356/373 |
| 4,891,584 | 1/1990 | Kamieniecki et al. | 324/158 D |
| 4,941,753 | 7/1990 | Wickramasinghe | 324/158 D |
| 4,992,728 | 2/1991 | McCord et al. | 324/158 R |
| 5,065,103 | 11/1991 | Slinkman et al. | 324/158 R |

OTHER PUBLICATIONS

Emil Kamineniecki, J. Appl. Phis. vol. 54, No. 11, pp. 6481-6487, Nov. 1983.

*Primary Examiner*—Vinh Nguyen
*Attorney, Agent, or Firm*—Ostrolenk, Faber, Gerb & Soffen

[57] ABSTRACT

A method of measuring C-V characteristics of a semiconductor wafer without forming an electrode on an oxide film thereof. An electrode 201 for C-V measurement is held above a semiconductor wafer 100 across a gap Ge of 1 micrometer or less, and a total capacity including that of the gap Ge is detected. The gap Ge is measured by utilizing the tunneling effect observed in total reflection of light wave. Parallelism of the electrode 201 to the wafer is adjusted by measuring the width of the gap or measuring the capacity of the gap at three different locations on the periphery of the electrode 201.

27 Claims, 18 Drawing Sheets n1 = 1.5103    k1 = 0.0 (BK7)

n2 = 1.0       k2 = 0.0 (AIR)

n3 = 3.673     k3 = 0.005 (SILICON)

$\lambda$ = 0.827 $\mu$m (GaAℓAs LASER)

$\theta$1 = 45°

$n1 = 1.5103 \quad k1 = 0.0 \text{ (BK7)}$ $n2 = 1.0 \quad k2 = 0.0 \text{ (AIR)}$ $n3 = 3.673 \quad k3 = 0.005 \text{ (SILICON)}$ $\lambda = 0.827 \mu m \text{ (GaAℓAs LASER)}$ $\theta 1 = 45°$

VACUUM PUMP 8

METHOD OF AND APPARATUS FOR MEASURING ELECTRIC CHARACTERISTICS OF SEMICONDUCTOR WAFER

CROSS-REFERENCE TO RELATED APPLICATIONS

This application is related to copending application Ser. No. 707,152, filed May 29, 1991, commonly assigned with the present invention.

BACKGROUND OF THE INVENTION

1. Field of the Invention

The present invention relates to measuring electric characteristics of a semiconductor wafer, such as a C-V curve.

2. Description of the Related Art

Manufacture of semiconductors, especially, of LSIs includes many process steps. Each process step must be meticulously executed to maintain the highest quality of the semiconductors. Manufacturers of semiconductors therefore carry out various tests to confirm that after each process step, the semiconductor maintains its electrical characteristic at a desired level.

C-V curve measurement is one method generally used for evaluating determine when the poor C-V characteristics are the result of a having MIS (Metal Insulator Semiconductor) structure.

FIGS. 1(a) through 1(c) are explanatory views showing a conventional method for obtaining a C-V curve. A semiconductor of MIS structure shown in FIG. 1(a) includes a semiconductor substrate 101, an oxide film 102 formed on the substrate, and an electrode 201 formed on the film 102. Another electrode 202 is also formed on the opposite surface of the substrate 101.

A total electrostatic capacity Ct between the two electrodes 201 and 202 is expressed by a series connection of a capacity Cs of the substrate 101 and a capacity Ci of the oxide film 102 as seen in FIG. 1(b).

A solid line and a broken line in FIG. 1(c) respectively represent an ideal or calculated C-V curve and an actual or measured C-V curve. In this C-v curve measurement, a flat band voltage Vfb is first obtained according to a shift between the ideal curve and the actual curve, and the quality of the semiconductor and manufacturing process thereof are then evaluated based on the flat band voltage Vfb.

The conventional C-V curve measurement thus requires the electrode 201 on the oxide film 102.

The step of forming the electrode 201 on the oxide film 102, however, sometimes causes contamination and damage in the oxide film 102 with impurity ions such as sodium. As generally known, the C-V characteristics depend on the concentration of the impurity ions in the oxide film 102. It has been difficult therefore to the process steps of manufacturing semiconductors poor quality of the oxide film 102 (resulting from a poor oxide film formation process (or the result of a poor quality of the electrode resulting from the electrode formation process.

The process of forming an oxide film includes a number of steps, such as cleaning of a semiconductor substrate, thermal oxidation, and stabilizing heat treatment of an oxide film. The adequacy of each step may be determined by evaluating the C-V curve after each step. However, evaluation of each step requires the formation of a test electrode on the substrate after each step; for example, C-V curve measurement after cleanup treatment of the substrate requires formation of a test electrode on the cleaned substrate.

According to the conventional method described above, a test electrode is required in each evaluation of electric characteristics of the semiconductor wafer. Formation of a test electrode on the semiconductor wafer is, however, both time and labor consuming, and moreover affects the electric characteristics of the semiconductor wafer.

Another method using a C-t curve, that is, variation of electrostatic capacity over time, is sometimes used for evaluating the characteristics at the surface portion of a semiconductor wafer. This method also requires a test electrode to be formed on the semiconductor as is the case with the C-V measurement; namely, it has the same problems as above.

SUMMARY OF THE INVENTION

An object of the present invention is to measure electric characteristics of a semiconductor wafer, such as C-V curve and C-t curve, without forming a test electrode on the semiconductor wafer.

According to the present invention, the foregoing and other objects are attained by an apparatus for measuring an electric characteristic of a semiconductor wafer, including: a test electrode; an electrode supporting apparatus for supporting the test electrode above the surface of the semiconductor wafer across a gap, and measuring the gap; and a measuring device for measuring an electric characteristic between the test electrode and the semiconductor wafer. A gap between the test electrode and the semiconductor wafer electrically acts as a condenser. The electrostatic capacity of the gap is determined based on the width of the gap measured by the electrode supporting apparatus. The total electric characteristics of the condenser and the semiconductor wafer are determined based on the electric characteristics between the measuring electrode and the semiconductor substrate detected by the detection device.

According to an aspect of the invention, the electrode supporting apparatus further comprises the following elements: a light source for monochromatic light; a light transmission reflector having a reflecting surface located substantially parallel to the surface of the semiconductor wafer across the gap for reflecting the monochromatic light at the reflecting surface such that geometric optical total reflection occurs, the reflecting surface holding the test electrode; a photosensor for measuring intensity of the monochromatic light reflected by the reflecting surface of the reflector; a base on which the light source, the reflector, and the photosensor are mounted; a first driving mechanism for relatively moving at least one of the base and the semiconductor wafer in a first direction defining the gap; and a gap determining device for determining the gap on the basis of the intensity of the reflected monochromatic light measured by the photosensor. Measurement of a gap by the electrode supporting apparatus can be accomplished by employing the theory of the tunneling effect, which is briefly explained here but will be given in detail later. When a gap between the reflecting surface of the reflector and the surface of the semiconductor wafer is substantially the same in size as the wavelength of monochromatic light or less than the wavelength while the laser beam is reflected by the reflector upon conditions of total reflection in geometrical optics, part of the monochromatic light is not reflected from the reflecting surface but is transmitted into the semiconductor wafer through the gap. Both the intensity of the transmitted light into the semiconductor wafer and the intensity of the reflected laser beam from the reflecting surface of the reflector vary with the width of the gap. The width of the gap is thus determined by measuring the intensity of the reflected light.

According to another aspect of the invention, the apparatus further comprises: plural parallelism-adjusting electrodes formed on the reflecting surface; and a parallelism adjusting apparatus for measuring an electrostatic capacity between the semiconductor wafer and each of the plural parallelism-adjusting electrodes, and adjusting the parallelism of the reflecting surface to the surface of the semiconductor wafer on the basis of comparison among the measured electrostatic capacities. The electrostatic capacity between each of the plural parallelism-adjusting electrodes and the semiconductor wafer is inversely proportional to the width of the gap between the semiconductor wafer and each of the plural electrodes. The parallelism of the reflecting surface to the surface of the semiconductor wafer is thus adjusted by comparing the electrostatic capacities measured by the plural electrodes to one another.

Alternatively, to maintain the parallel configuration, the apparatus includes a: light generation device for generating plural monochromatic light beams incident on the reflecting surface on the condition of total reflection in terms of geometrical optics; plural photosensors for measuring the intensities of the plural reflected beams of the plural monochromatic light beams reflected by the reflecting surface; and a parallelism adjusting apparatus for adjusting the parallelism of the reflecting surface to the surface of the semiconductor wafer on the basis of comparison among the intensities of the plural reflected beams. The intensity of light reflected by the reflecting surface depends on the width of the gap between the electrode supporting face and the surface of the semiconductor wafer. Accordingly, the parallelism of the reflecting surface to the surface of the semiconductor wafer is adjusted by comparing the intensities of plural monochromatic light beams detected by the plural photosensors with one another.

According to still another aspect of the invention, the gap determining device includes a device for comparing the intensity of the reflected monochromatic light with a calculated value of the intensity according to Maxwell's equations on the condition of total reflection with respect to the gap, thereby determining the gap.

Preferably, the light source generates monochromatic light comprising a laser beam, and the gap is less than 1 micrometer.

According to another aspect of the invention, the apparatus further consists of: a suction pump; and a conductive suction table on which the semiconductor wafer is sucked by the suction pump to be fixed; and wherein the measuring device includes a device for measuring an electric characteristic between the test electrode and the conductive suction table to obtain the electric characteristic between the test electrode and the semiconductor wafer.

In the preferred embodiments, the electric characteristic is a dependance of an electrostatic capacity on a voltage between the test electrode and a substrate of the semiconductor wafer.

The present invention is also directed to a method of measuring an electric characteristic of a semiconductor wafer, comprising the steps of:

(a) preparing a test electrode and a semiconductor wafer;

(b) supporting the test electrode above the surface of the semiconductor wafer across a gap, and measuring the gap; and (c) measuring an electric characteristic between the test electrode and the semiconductor wafer.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11($b$) is an enlarged bottom view illustrating the prism of FIG. 11($a$);

DESCRIPTION OF THE PREFERRED EMBODIMENT

A. Outline of Measurement

Figure 1A:
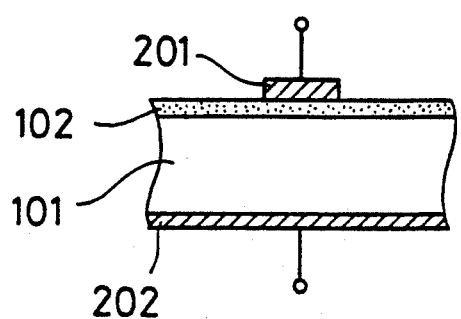
FIG. 1 is an explanatory view showing a conventional method for measuring C-V curves.
Figure 1B:
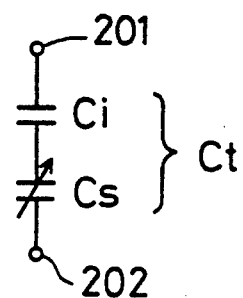
Figure 1C:
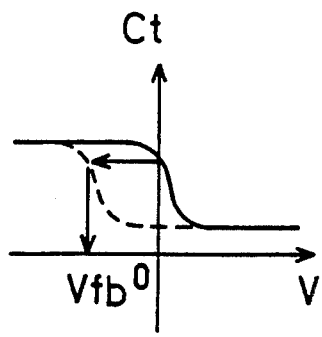
Figure 2A:
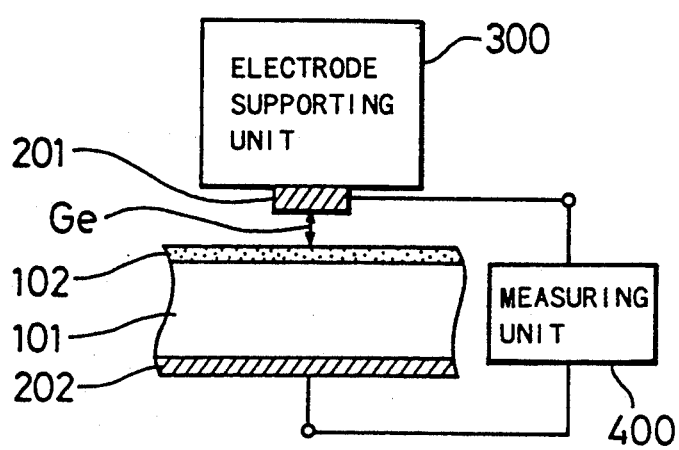
FIG. 2 is an explanatory view showing a method of measuring electric characteristics of semiconductors according to the invention.

FIG. 2 is a schematic view illustrating the outline of the electric characteristics measurement according to the present invention. As shown in FIG. 2(a), an oxide film 102 is formed on one surface of a semiconductor substrate 101 and an electrode 202 is formed on the other surface of the substrate 101. A test electrode 201 is held above the oxide film 102 across a gap Ge by an electrode supporting unit 300. The gap Ge between the oxide film 102 and the test electrode 201 is controlled to be no more than about one micrometer by the electrode supporting unit 300 as described later in detail.

Figure 2B:
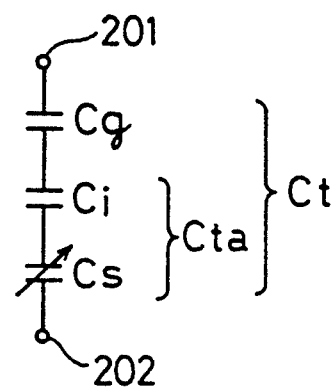

An electrostatic capacity Ct between the two electrodes 201 and 202 is expressed, as shown in FIG. 2(b), by a series connection of a capacity Cs of the substrate 101, a capacity Ci of the oxide film 102, and a capacity Cg of the gap Ge as follows:

$$1/Ct = 1/Cs + 1/Ci + 1/Cg \quad (1)$$

The total electrostatic capacity Ct is measured by a measuring unit 400.

The C-V curve to be measured here is the voltage dependence of a resultant capacity Cta which consists of the capacities Cs and Ci. The resultant capacity Cta is expressed as follows:

$$1/Cta = 1/Cs + 1/Ci \quad (2)$$

The resultant capacity Cta of Equation (2) is obtained by measuring the total capacity Ct of Equation (1) because the capacity Cg of the gap Ge can be calculated. Here an extremely small value for the capacity Cg of the gap Ge makes the result of the capacity Cta inaccurate as clearly shown by Equation (1). The capacity Cg of the gap Ge is generally expressed as follows:

$$Cg = \epsilon_0 * S / Ge \quad (3)$$

where $\epsilon_0$ denotes a dielectric constant of vacuum, S denotes an area of the lower face of the electrode 201, and the symbol * denotes multiplication.

The capacity Cg is inversely proportional to the gap Ge; that is the larger the gap Ge, the smaller the capacity Cg. When the gap Ge is greater than about one micrometer, the capacity Cg becomes far smaller than the other capacities Cs and Ci, and this makes the total capacity Ct substantially equal to the capacity Cg of the gap Ge. Namely, when Cg<<Cs and Ci, Equation (1) is rewritten as:

$$Ct \approx Cg \quad (4)$$

In the apparatus of the invention, control of the gap Ge by the electrode supporting unit 300 prevents the capacity Cg from being too small. This ensures the measurement of a desired C-V curve shown by broken line in FIG. 2(c), and allows accurate evaluation of electric characteristics of the semiconductor.

B. Principle of gap measurement

The gap Ge is measured by employing the theory of the tunneling effect observed in total reflection of light at a boundary of mediums.

The tunnel effect is generally observed in physical phenomena expressed by a wave function, including reflection of light. More specifically, when boundary conditions are provided on the boundary plane of a medium, the wave function exponentially damps outside the boundary plane. This means that the wave oozes or tunnels from the boundary plane as far as its wavelength.

When light is incident on an optically thin medium, e.g., air, from an optically dense medium e.g., glass, at an incident angle greater than its critical angle, total reflection in terms of geometrical optics is observed. When the propagation of light (or electric field) is expressed by a wave function, the wave function representing the light (or the electric field) is transmitted into the optically thin medium (or the air) in spite of the total reflection condition in terms of geometrical optics.

Figure 3:
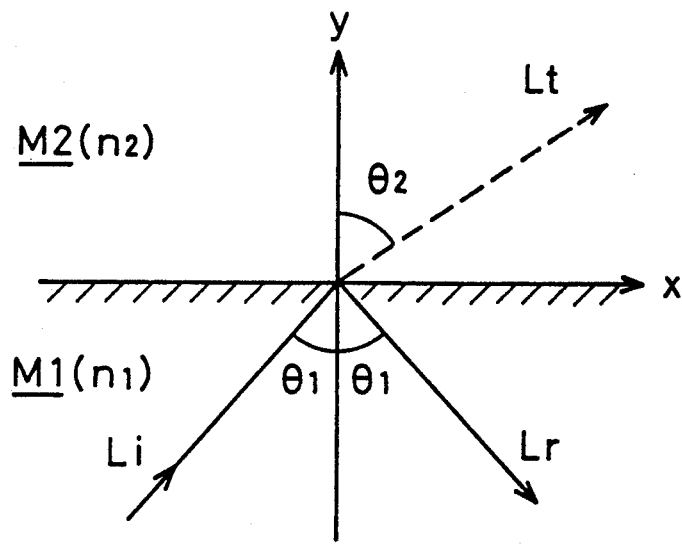
FIG. 3 is a diagram showing transmittance of light in a double layered structure.

FIG. 3 is a diagram showing an optical path of light transmitted from an optically dense medium M1 to an optically thin medium M2. Incident light Li is linearly polarized light having a polarization direction in the x-y plane. In other words, its electrostatic vector is parallel with the x-y plane. The incident light Li is incident on a boundary between the media M1 and M2 at an incident angle $\theta 1$. Refractive indices of the medium M1 and the medium M2 are n1 and n2, respectively. FIG. 3 shows light Lt oozing into the medium M2 at an angle $\theta 2$ as well as reflected light Lr although this figure satisfies the total reflection condition in terms of geometrical optics. The electric field Et of the through-light Lt is expressed by the following wave function:

$$Et = E0 * \exp(-kt*\alpha*y) \exp[i*\{kt(n1/n2) \sin \theta 1 * x - \omega * t\}] \quad (5)$$

where E0 is a constant; kt and $\alpha$ are constants expressed by the following equations (6) and (7), respectively; $\omega$ represents angular frequency of the light; and the operator "*" denotes multiplication.

$$kt = n2 * (2 * \pi) / \lambda \quad (6)$$

$$\alpha = [(n1/n2)^2 * (\sin \theta 1)^2 - 1]^{0.5} \quad (7)$$

where $\lambda$ denotes a wavelength of the light.

In equation (5), the term $\exp(-kt*\alpha*y)$ shows that the electric field of the light wave is transmitted into the medium M2 and the amplitude of the electric field |Et| exponentially and monotonously decreases in a distance as far as the wavelength $\lambda$.

Equations used here are equivalent to the equations shown in Fineman, Rayton, and Sanz, "Fineman Physics", Vol. IV, Electromagnetic Wave and Properties (Japanese version); Iwanami, March, 1986; page 196, line 20.

If the medium M2 is air, n2 is equal to 1.0 and the equations (5) through (7) are rewritten as the following equations (5a) through (7a):

$$Et = E0 * \exp(-kt*\alpha*y) \exp[i*\{kt*n1* \sin \theta 1*x - \omega*t\}] \quad (5a)$$

$$kt = (2\pi)/\lambda \quad (6a)$$

$$\alpha = [(n1* \sin \theta 1)^2 - 1]^{0.5} \quad (7a)$$

Figure 4:
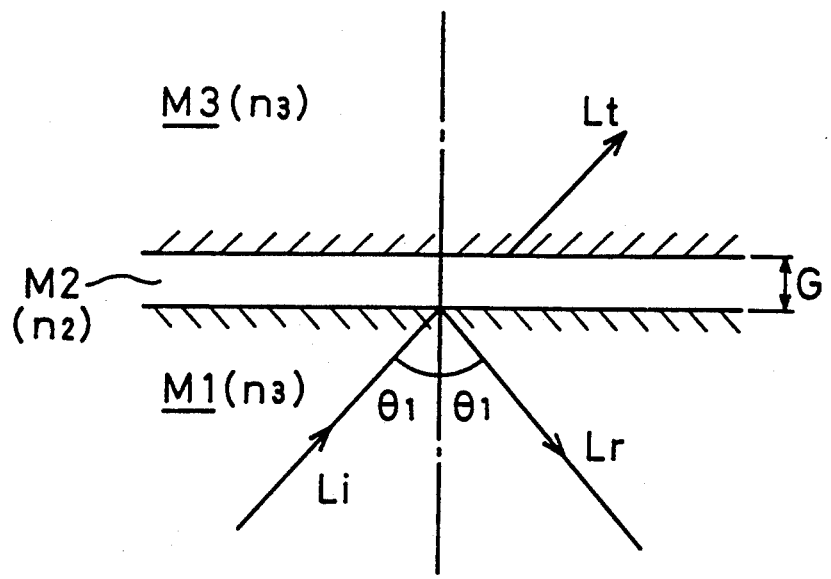
FIG. 4 is a diagram showing transmittance of light in triple layered structure

Suppose that, from the state of FIG. 4, another optically dense medium M3 approaches from in the air M2 down to the medium M1, as shown in FIG. 4. When a gap G between the medium M1 and the third medium M3 decreases to be approximately equal to the wavelength $\lambda$, dipole moment of the third medium M3 is excited and the light wave begins to be transmitted into the third medium M3. The electric field of the light Lt transmitted into the third medium M3 is approximated by the equations (5a) through (7a) stated above. Here the intensity of the transmitted light Lt is known to be proportional to the square of the amplitude $|Et|$ of the electric field.

The gap G can be found from the relation between the intensity of the transmitted light Lt and the gap G according to the equations (5a) through (7a); namely, the gap G can be measured by calculating in advance the relation between the intensity of the transmitted light Lt and the gap G, and by substituting the observed intensity of the transmitted light Lt in the relation. For more precise calculation of the electric field Et of the transmitted light Lt, Maxwell's equations, instead of the equations (5a) through (7a), will be required to be solved on the boundary conditions for the three layer structure consisting of the three media M1, M2, and M3. The calculation can be executed with a computer; a computer program applicable to the calculation is, for example, shown in Tohru Kusakawa, "Lens Optics", Tokai University Press, 1988, pages 295-310.

The intensity of the reflected light Lr is measured for use in determining the gap instead of the intensity of the light Lt transmitted into the optically dense medium M3 on account of the difficulty in measurement of the intensity of the transmitted light Lt. The relation among the intensities Pi, Pr, and Pt of the incident light Li, the reflected light Lr, and the transmitted light Lt, respectively, is expressed as follows:

$$Pt/Pi = 1 - Pr/Pi \tag{8}$$

Table 1 shows the reflectance Rr ($=Pr/Pi$) of the reflected light Lr given by the precise calculation of the electric field of the light wave propagated through the three layer structure. Results in Table 1 are for s-polarized light, p-polarized light and linearly polarized light having a polarization direction at an angle of 45 degrees to each of s- and p-polarized light (hereinafter referred to as s+p polarized light).

TABLE 1

| Gap | Reflectance Rr (= Pr/Pi) | | |
|---|---|---|---|
| G (μm) | s-polarized | p-polarized | s + p polarized |
| 0.0 | 0.285 | 0.081 | 0.183 |
| 0.1 | 0.508 | 0.152 | 0.330 |
| 0.2 | 0.758 | 0.325 | 0.542 |
| 0.3 | 0.881 | 0.524 | 0.702 |
| 0.4 | 0.939 | 0.691 | 0.815 |
| 0.5 | 0.967 | 0.810 | 0.889 |
| 0.6 | 0.982 | 0.887 | 0.935 |
| 0.7 | 0.990 | 0.934 | 0.962 |
| 0.8 | 0.994 | 0.962 | 0.978 |
| 0.9 | 0.997 | 0.979 | 0.988 |
| 1.0 | 0.998 | 0.988 | 0.993 |

Conditions for Table 1 are as follows:
n1 = 1.5103,
n2 = 1.0,
n3 = 3.673,
k1 = 0.0 (borosilicate glass, BK7)
k2 = 0.0 (air)
k3 = 0.005 (silicon)
$\lambda$ = 0.827 μm (GaAlAs laser)
$\theta$1 = 45 degrees k1, k2, and k3 denote extinction coefficients of the media M1 (BK7), M2 (air), and M3 (silicon), respectively.

Any linearly polarized light can be separated into an s-polarized light component and a p-polarized light component. When the polarization direction of a linearly polarized light deviates at an angle of $\theta$ to that of the s-polarized light, the reflectance Rra of the linearly polarized light is a function of the reflectance Rrs of the s-polarized light and the reflectance Rrp of the p-polarized light as given below:

$$Rra = \cos^2\theta \cdot Rrs + \sin^2\theta \cdot Rrp \tag{9}$$

Figure 5A:
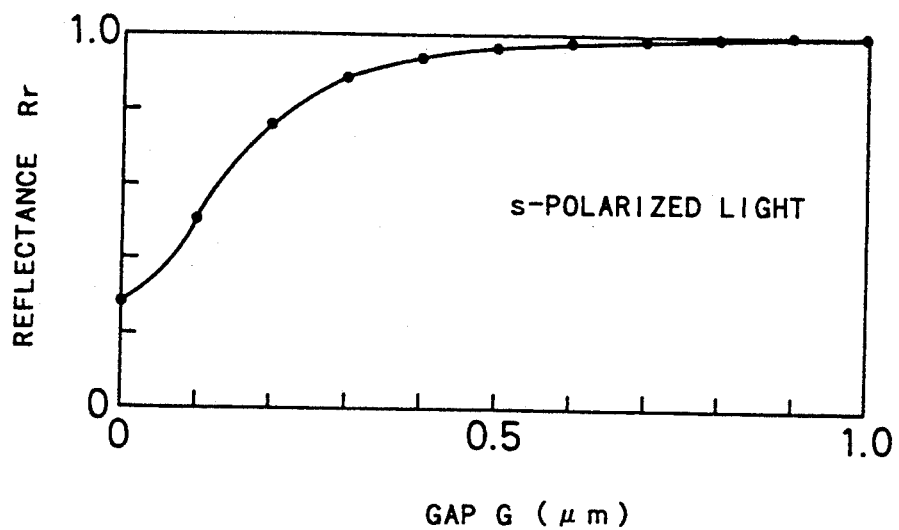
FIGS. 5A through 5C are graphs showing the relationship between the width of the gap and the reflectance.
Figure 5B:
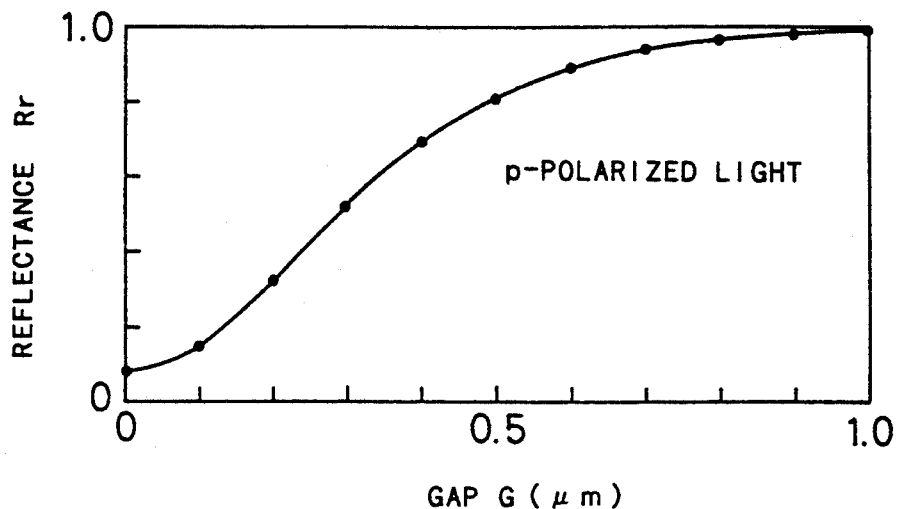
Figure 5C:
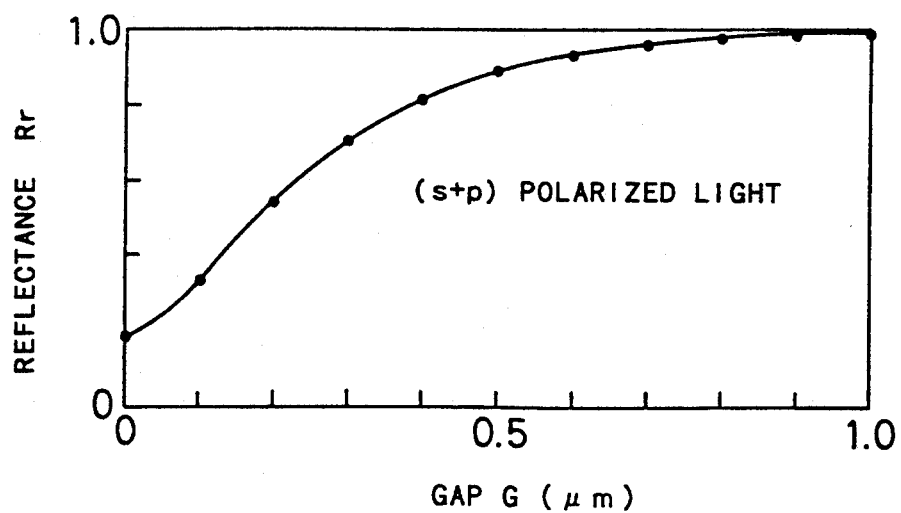

FIGS. 5A through 5C are graphs showing the relations in Table 1. In these graphs, the abscissa is the gap G and the ordinate is the reflectance Rr. When the gap G is far larger than the wavelength $\lambda$, the reflectance Rr is approximately 100%, which means total reflection. When the gap G is equal to zero, on the other hand, the reflectance Rr is close to zero, which means that almost all of light is transmitted.

Figure 6A:
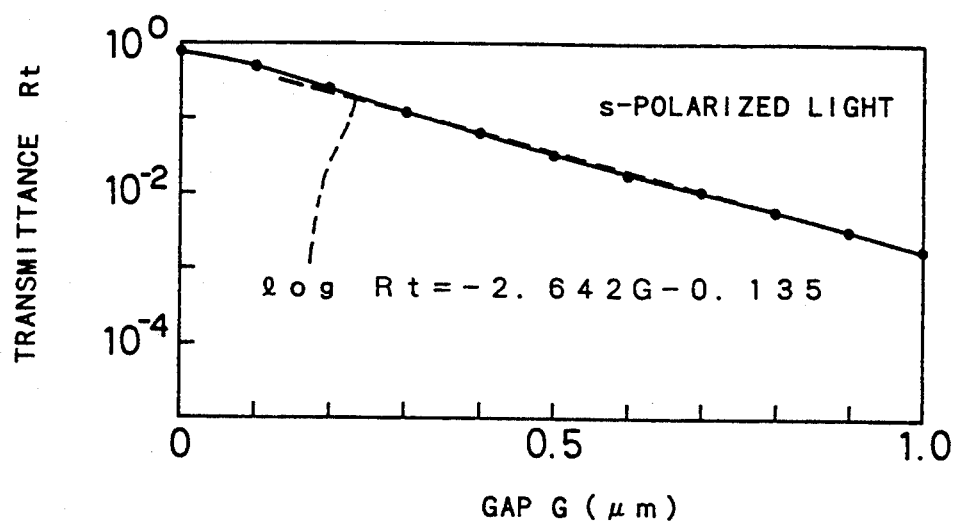
FIGS. 6A through 6C are graphs showing the relationship between the width of the gap and the transmittance.
Figure 6B:
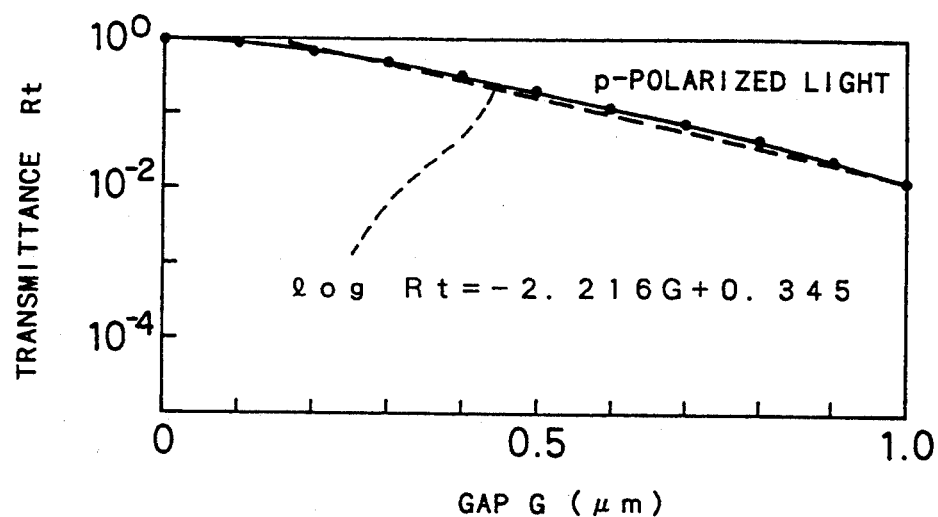
Figure 6C:
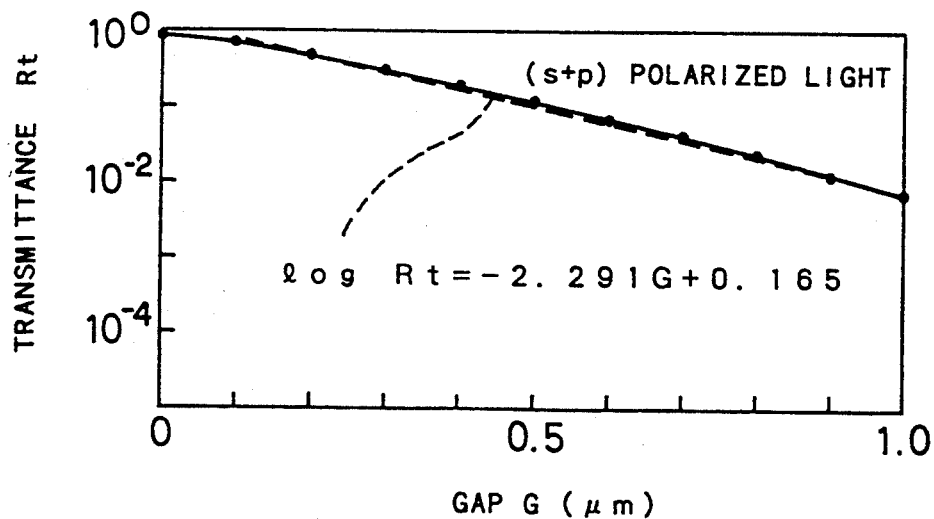

As equation (8) clearly shows, the transmittance Rt ($=Pt/Pi$) is equal to (1−Rr). FIGS. 6A through 6C are graphs showing the transmittance Rt plotted against the gap G. The ordinate scale for the transmittance Rt is logarithmic. The transmittance curve log(Rt) can be approximated by a straight line except for a range of the gap G near zero. Broken lines in FIGS. 5A through 5C show approximations in the range of the gap G between 0.2 and 1.0 μm and are respectively expressed as follows:

$$\log Rt = -2.642G - 0.135 \tag{10a}$$

$$\log Rt = -2.216G - 0.345 \tag{10b}$$

$$\log Rt = -2.291G - 0.165 \tag{10c}$$

Figure 7A:
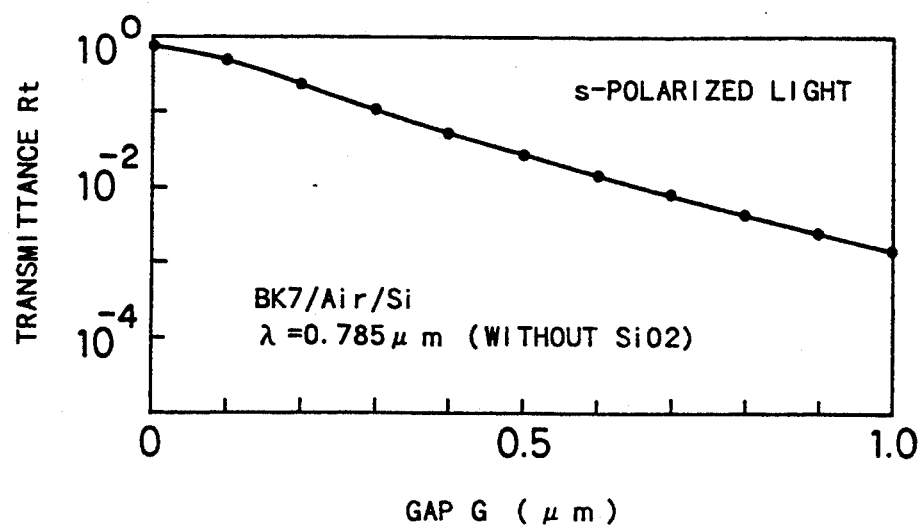
FIGS. 7A, 7B, 8A, and 8B are graphs showing the relationship between the width of the gap and the transmittance under other conditions.
Figure 7B:
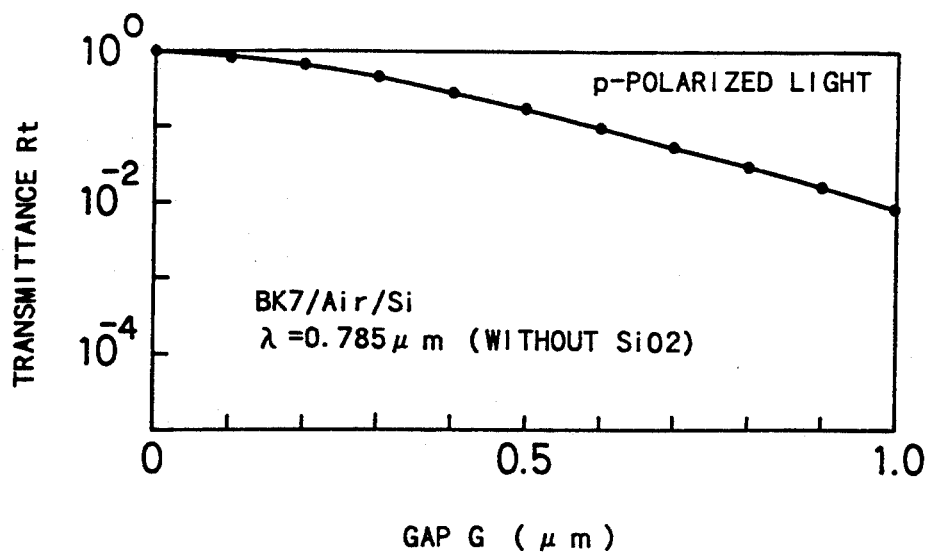
Figure 8A:
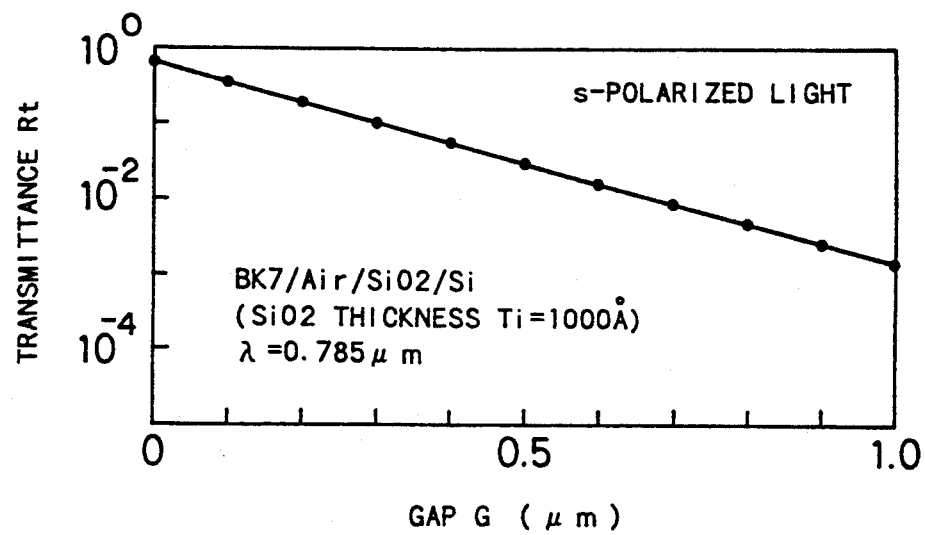
Figure 8B:
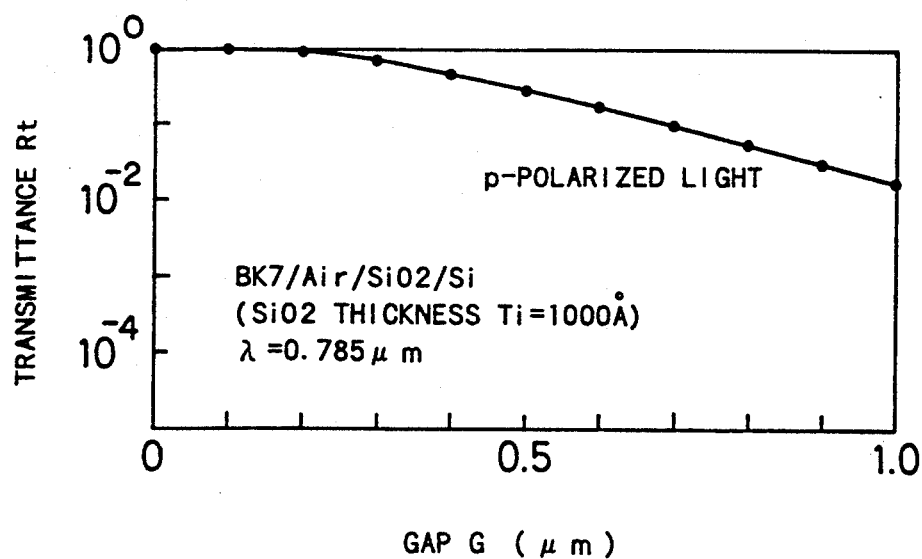

FIGS. 7A and 7B show variation of the transmittance Rt of laser beam of another wavelength in the three layered structure of BK7/air/silicon. FIGS. 8A and 8B show variation of the transmittance Rt in a four layered structure of BK7/air/silicon dioxide film/silicon. The constituents are shown in the order of mediums M1/M2/M3(/M4). A thickness Ti of the silicon dioxide is equal to 1,000 angstrom. The transmittance of (s+p)-polarized light is omitted in the figures because it can be calculated from those of s-polarized light and p-polarized light.

The reflectance and transmittance for the four layered structure of FIGS. 8A and 8B are obtained according to Maxwell's equation in the same manner as the three layered structure.

The transmittance curve of "log Rt" plotted against the gap G is approximated by a straight line irrespective of the wavelength of the laser beam and of the difference in material of the third medium M3.

As described above, the gap G is measured by firstly measuring the reflectance of the laser beam for the multi-layer structure, and by secondly substituting the reflectance in the relation between the gap G and the reflectance or the transmittance calculated in advance.

C. Structure of Apparatus

Figure 9:
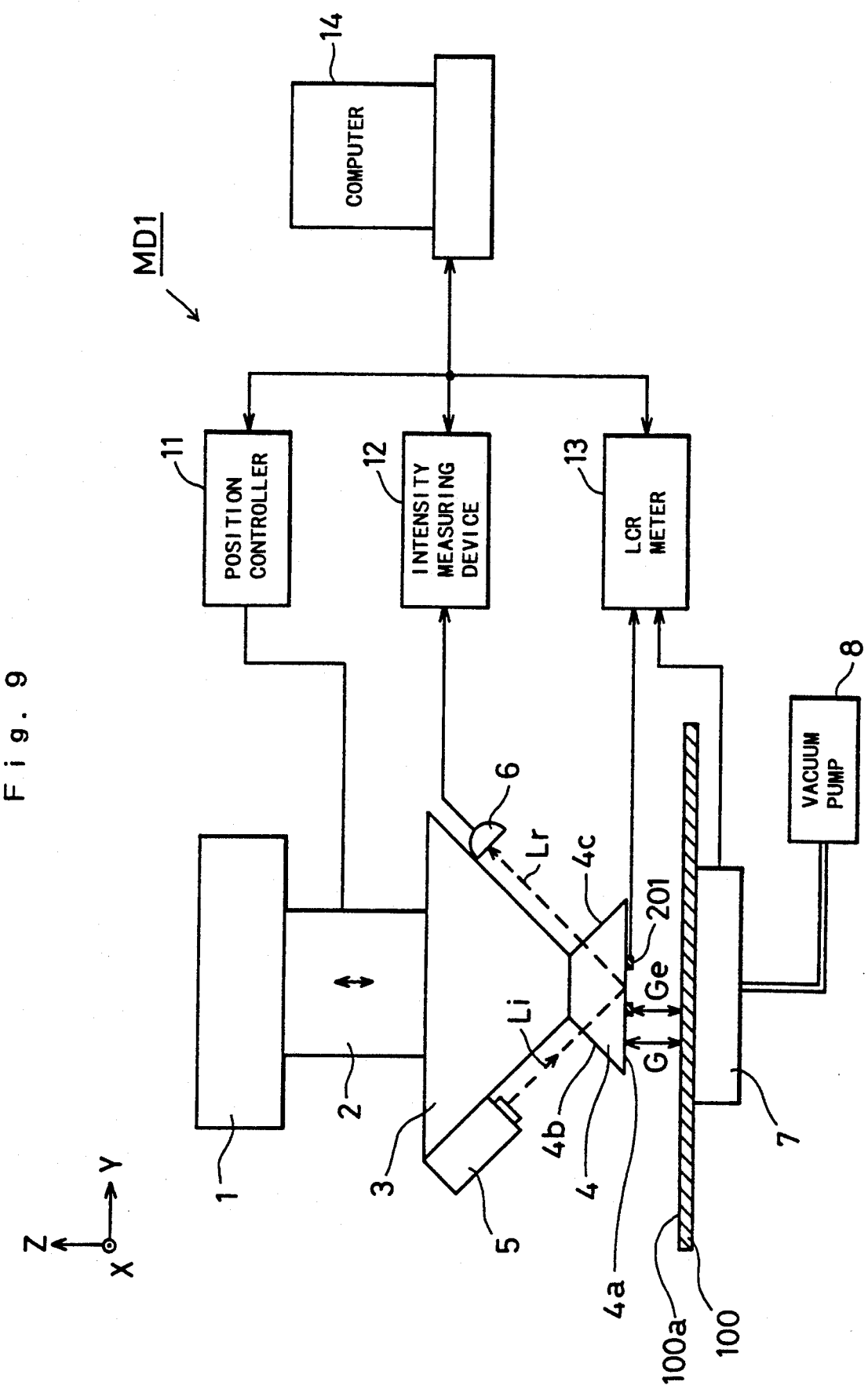
FIG. 9 is a schematic block diagram showing the structure of an apparatus for measuring electric characteristics embodying the invention.

FIG. 9 is a schematic block diagram showing the structure of an apparatus MD1 for measuring electric characteristics of a semiconductor wafer including C-V curve. The apparatus MD1 includes a device for measuring a gap between the test electrode 201 and the surface of the semiconductor wafer according to the above theory.

The apparatus MD1 includes a base 1, a piezoelectric actuator 2 attached to the lower face of the base 1, and a trapezoid stand 3 mounted on the lower end of the piezoelectric actuator 2. Two slant faces of the stand 3 are formed perpendicular to each other. A prism 4 is further mounted on the lower end of the stand 3. A laser source 5, for example, GaAlAs laser, is fixed to an end of one slant face of the stand 3, and a photosensor 6 such as a photodiode to an opposite end of the other slant face thereof.

The prism 4 is made of borosilicate glass (BK7) and has a bottom face 4a located in parallel with the surface of a sample table 7 (or x-y plane), on which a semiconductor wafer 100 is placed. The prism 4 has an incident face 4b and an exit face 4c which are perpendicular to each other and arranged to have an angle of 45 degrees to the bottom face 4a.

The semiconductor wafer 100 on the sample table 7 is held below the prism 4 across a gap G in such a manner that its surface 100a is substantially in parallel with the bottom face 4a of the prism 4.

A position controller 11 is connected to the piezoelectric actuator 2. An intensity measuring device 12 is connected to the photosensor 6, and an LCR meter 13 is connected to the test electrode 201 and the metal table 7. The LCR meter 13 measures the total capacity Ct and conductance between the test electrode 201 and the table 7.

The position controller 11, the intensity measuring device 12, and the LCR meter 13 are connected to a computer 14 such as a personal computer, which controls the whole apparatus and processes measured data.

The electrode supporting unit 300 in FIG. 2 is implemented by the combination of the base 1, the piezoelectric actuator 2, the stand 3, the prism 4, the laser source 5, the photosensor 6, the position controller 11, the intensity measuring device 12, and the computer 14.

The LCR meter 13 and the computer 14 constitute the measuring unit 400 in FIG. 2.

The piezoelectric actuator 2 has a piezoelectric element extensible and contractible in the z direction, and moves the stand 3 in the z direction in response to the voltage applied by the position controller 11.

Figure 10A:
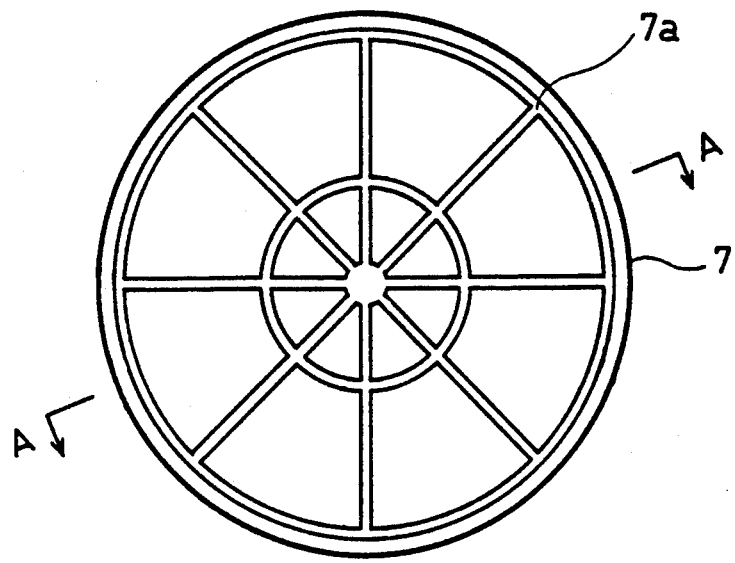
FIG. 10 illustrates a sample table.
Figure 10B:
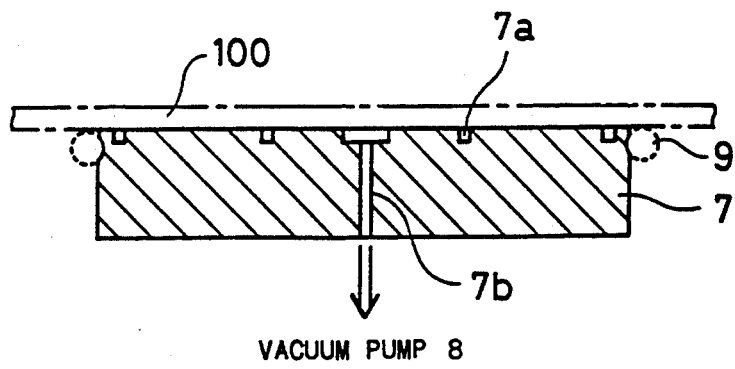

The sample table 7 is made of a metal such as SUS, a stainless steel defined in the Japanese industrial standard. A semiconductor wafer 100 is sucked on the sample table 7 by a vacuum pump 8. FIG. 10(a) is a plan view of the sample table 7 and FIG. 10(b) is a cross sectional view thereof taken on the line A—A. A groove 7a formed on the surface of the table 7 includes two concentric parts and plural radial linear parts connecting the circles to each other. The center of the groove 7a is connected to a through hole 7b which runs through the sample table 7 and is connected with the vacuum pump 8. When the groove 7a is evacuated by the vacuum pump 8, the semiconductor wafer 100 shown by one-dot chain line in FIG. 10 is drawn onto the sample table 7 with suction. The contact between the semiconductor wafer 100 and the sample table 7 is ensured by mirror like finishing of the surface of the table 7 and plural O-rings (shown by broken line) attached to the side of the table 7.

An electrostatic capacity Cb between the semiconductor wafer 100 and the sample table 7 is part of the total capacity Ct measured by the LCR meter 13. Accordingly, Equation (1) is rewritten as:

$$1/C_t = 1/C_s + 1/C_i + 1/C_g + 1/C_b \qquad (11)$$

Figure 2C:
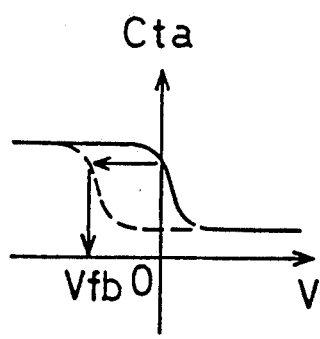

The capacity Cb is required to be sufficiently larger than the other three capacities Cs, Ci, and Cg in the left hand side of Equation (11) to obtain a C-V curve as shown in FIG. 2(c). Here the total capacity Ct is approximated by Equation (1). In the embodiment, the capacity Cb is maintained large by the contact of the semiconductor wafer 100 onto the sample table 7.

Ohmic contact of the lower face of the semiconductor wafer 100 with the upper face of the table 7 is preferable in obtaining a C-V curve. The ohmic contact eliminates the need for the capacity Cb to be taken into account for the total capacity Ct. However, the ohmic contact requires an ohmic electrode formed on the lower face of the semiconductor wafer 100. According to the suction contact by the vacuum pump 8, on the other hand, the semiconductor wafer 100 is sucked to the sample table 7 and thus the capacity Cb therebetween becomes negligible in the total capacity Ct. The suction contact does not require the formation of an ohmic electrode and enables measurement of electric characteristics of semiconductor wafers at higher speeds.

Figure 11A:
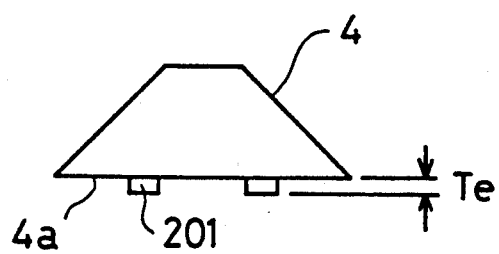
FIG. 11($a$) is an enlarged front view illustrating a prism.
Figure 11B:
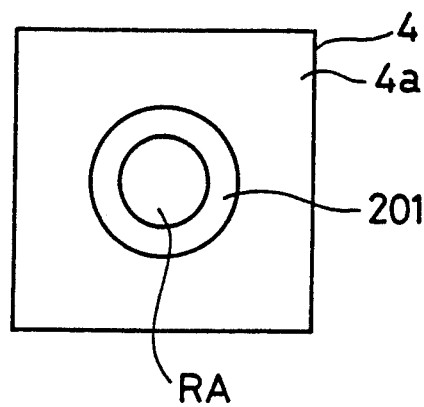

FIGS. 11(a) and 11(b) are an enlarged front view and an enlarged bottom view of the prism 4. A circular test electrode 201 is formed on the bottom face 4a of the prism 4. A reflecting area RA surrounded by the test electrode 201 is part of the bottom face 4a and reflects laser beams emitted from the laser source 5.

The electrode 201 having a double layered structure of chromium (Cr) and gold (Au) is formed on the bottom face 4a by vacuum evaporation in the following steps. A photo resist is firstly applied on the bottom face 4a to form a resist pattern with an opening for the electrode 201. Chromium and gold are successively vacuum-evaporated to form a double layered structure, and the resist pattern is then peeled off.

A preferable thickness Te of the electrode 201 ranges between 1,000 and 2,000 angstrom. The thickness Te is measured with an interference microscope prior to attachment of the prism 4 to the stand 3.

As seen in FIG. 9, a laser beam Li emitted from the laser source 5 enters the incident face 4b of the prism 4 at an incident angle of 90 degrees and then incident on the reflecting area RA of FIG. 11 on the bottom face 4a at an incident angle of 45 degrees. Since the critical angle of incidence is 41.5 degrees under the conditions of Table 1, all conditions required for total reflection in terms of geometrical optics are fulfilled. The reflected light Lr, perpendicularly passing through the exit face 4c is received by the photosensor 6 and measured by the intensity measuring device 12.

The computer 14 calculates the transmittance Rt, the gaps G and Ge, and the electrostatic capacity Ce based on the quantity of the reflected light Lr measured by the intensity measuring device 12.

D. Details of gap measurement and detection of electric characteristics of semiconductors The gap G between the bottom face 4a of the prism 4 and the surface of the semiconductor wafer 100 is measured in the following steps.

First, the gap G is held to be several times as large as the wavelength λ of the laser beam. In this state, the laser beam Li is emitted to be reflected by the prism 4. The intensity measuring device 12 detects the intensity of the reflected light Lr received by the photosensor 6. The laser beam Li is not transmitted through the gap G of the width several times the wavelength λ, but is totally reflected by the bottom surface 4a of the prism 4. The intensity of the reflected light Lr thus detected by the photosensor 6 represents an intensity Pi of the incident light Li. The intensity Pi of the incident light Li is thus measured.

Second, the position controller 11 drives the piezoelectric actuator 2 to move the stand 3 in the (−z) direction to reduce the gap G to a value of about the wavelength λ. The laser beam Li is again emitted, and the intensity Pr of the reflected light Lr is detected by the photosensor 6. Here, part of the laser beam Li is transmitted into the semiconductor wafer 100.

The computer 14 calculates the reflectance Rr and the transmittance Rt (=1−Rr). The reflectance Rr is calculated by dividing the intensity Pr of the reflected light Lr by the intensity Pi of the incident light Li.

When the incident light Li is s-polarized light, the gap G is determined based on the relationship between the transmittance Rt and the gap G shown in FIG. 7A or FIG. 8A.

The gap G can be determined by referring to a look-up table and by interpolating the data if necessary, which look-up table represents the relationship shown in FIG. 7A, 7B, 8A or 8B and is memorized in the computer 14 in advance. Alternatively, the gap G can be determined based on the relationships between the gap G and the transmittance Rt expressed by Equations (10a) through (10c) stored in the computer 14. Other functions representing relationships between the transmittance Rt or reflectance Rr and the gap G can be used for Equations (10a) through (10c); for example, higher order, logarithmic, and exponential functions.

The computer 14 calculates the C-V curve in the following steps.

The gap Ge between the lower surface of the electrode 201 and the upper surface of the semiconductor wafer 100 is calculated by:

$$Ge = G - Te \qquad (12)$$

where Te is a thickness of the electrode 201 from the bottom surface 4a of the prism 4.

In order to eliminate the calculation of Equation (12), the electrode 201 can be fully embedded in the prism 4 so that the bottom surface of the electrode 201 becomes even with that of the prism 4; this makes the value Te equal to zero.

The electrostatic capacity Cg of the gap Ge is calculated by Equation (2).

The total capacity Ct against the voltage is measured with the LCR meter 13. The voltage dependence of the resultant capacity Cta of the capacities Cs and Ci is obtained by subtracting the capacity Cg of the gap Ge from the total capacity Ct measured.

Figure 12:
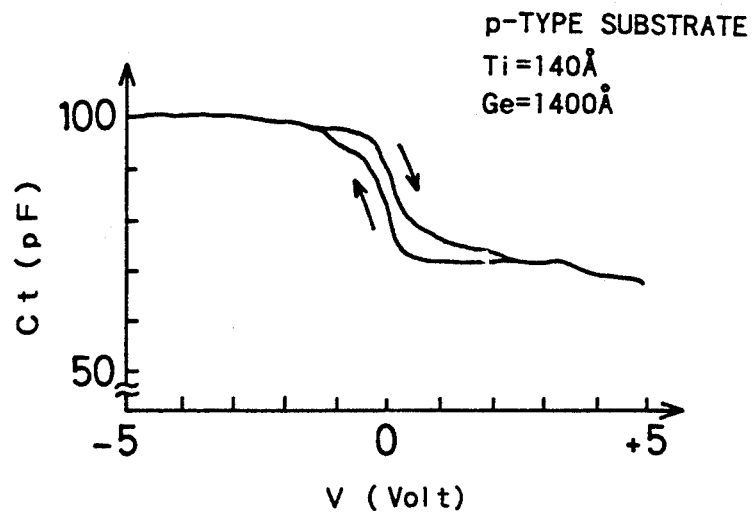
FIG. 12 is a graph showing an example of a C-V curve.

FIG. 12 shows an example of such C-V curves obtained according to the high frequency measurement under the following conditions: the gap Ge is equal to 1,400 angstrom, and the frequency of voltage applied is 100 KHz. Here, a sample wafer includes the oxide film 102 of 140 angstrom in thickness formed on a p-type semiconductor substrate 101. The quality of the oxide film 101 and its manufacturing process are then evaluated based on the C-V curve in the same manner as the conventional method.

Figure 13A:
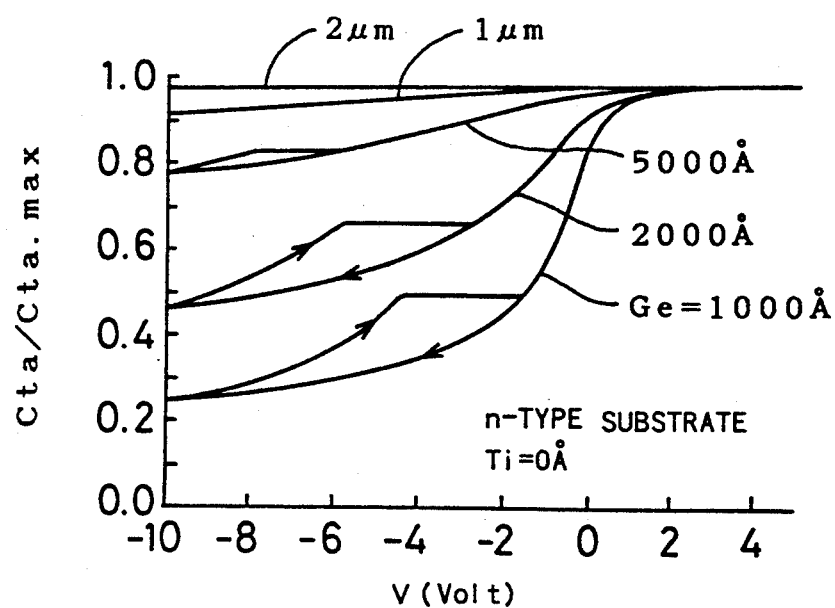
FIGS. 13A and 13B are graphs showing ideal C-V curves with varying width of the gap.
Figure 13B:
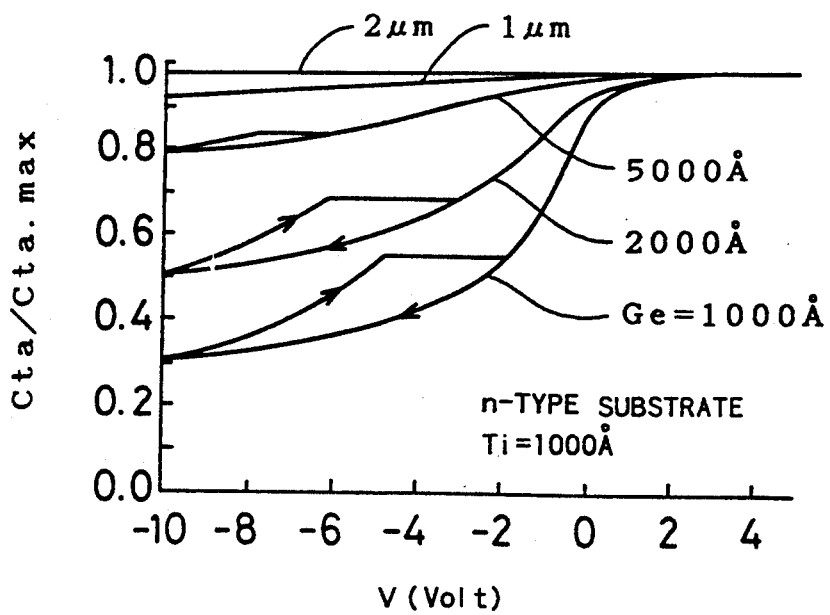

FIGS. 13A and 13B are graphs showing the C-V curves with the gap Ge varying from 1,000 angstrom to 2 micrometer. FIGS. 13A and 13B show C-V curves for the samples of a n-type semiconductor substrate without an oxide film 102 and with an oxide film 102 of 1,000 angstrom in thickness Ti, respectively. Plateau ranges are observed in both FIGS. 13A and 13B, in which the capacity is kept constant while the voltage is changing; the capacity at the plateau range is known to be equal to the so-called inversion capacity.

Since the C-V curves for the gap Ge of greater than 1 micrometer show very small changes, the flat band voltage is difficult to measure for those gaps. Accordingly, the preferable width of the gap Ge between the electrode 201 and the semiconductor wafer 100 is no more than 1 micrometer.

E. Other Embodiments

Figure 14:
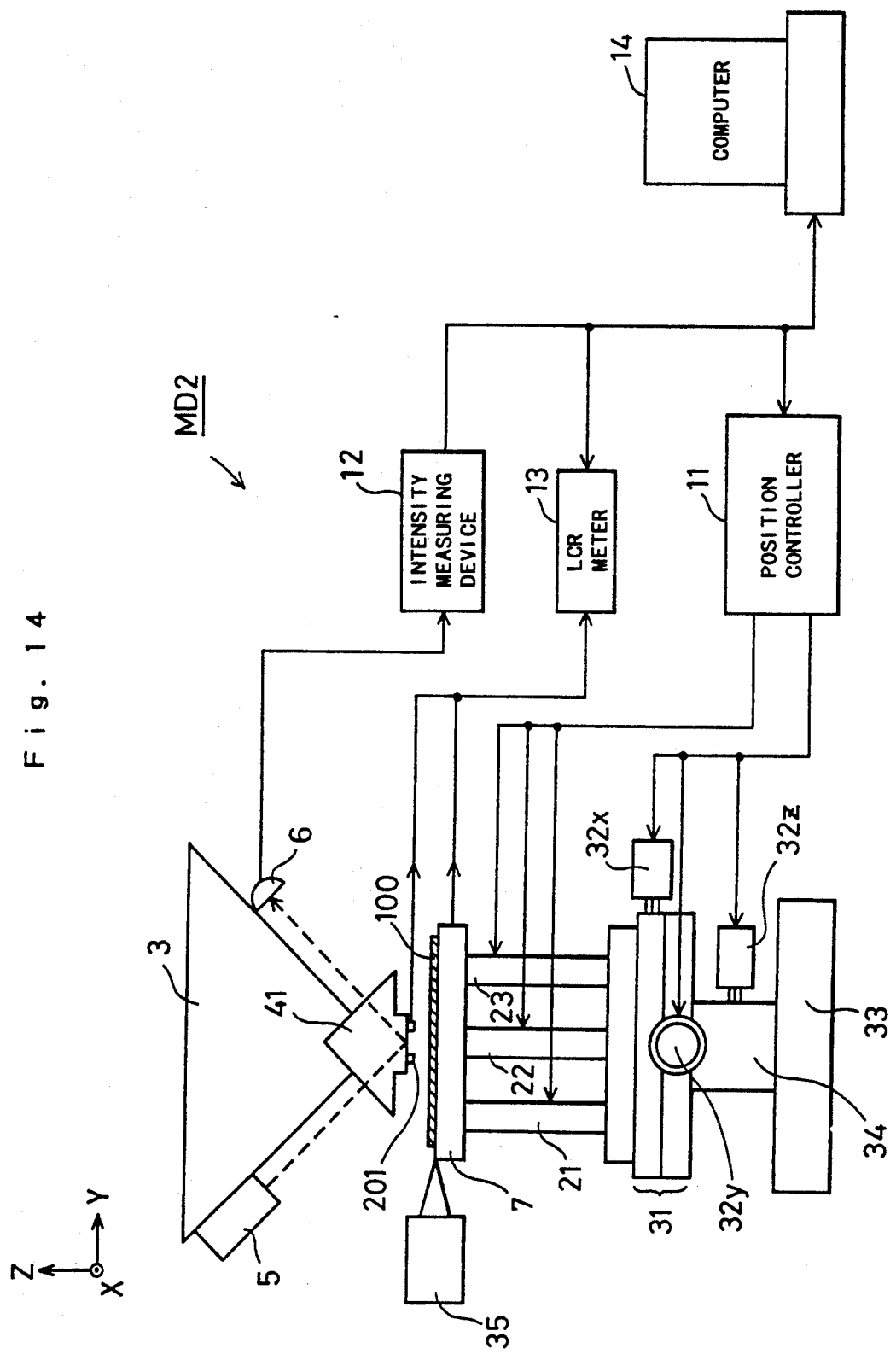
FIG. 14 is a schematic block diagram showing the structure of an apparatus for measuring electric characteristics as a second embodiment of the invention.

FIG. 14 is a block diagram showing the structure of an apparatus MD2 for measuring electric characteristics as a second embodiment of the invention.

The apparatus MD2 includes a prism 41, the laser source 5, and the photosensor 6 fixed onto the stand 3. The sample table 7 is supported by three piezoelectric actuators 21 through 23 supported by an x-y table 31. The x-y table 31 is supported by a vertical column 34 which is supported by a base 33. The x-y table 31 is driven by an x-axis driving motor 32x and a y-axis driving motor 32y for movement in the x-y plane. The x-y table 31 is further driven by a z-axis driving motor 32z to move in the z-direction.

The sample table 7 is brought close to the prism 41 in the following manner. First, the sample table 7 is lifted by the z-axis driving motor 32z to the height of an initial positioning sensor 35. The height of the table 7 is then finely adjusted with the piezoelectric actuators 21 through 23. Here the piezoelectric actuators 21 through 23 and the motors 32x, 32y, and 32z are all controlled by the position controller 11.

Figure 15:
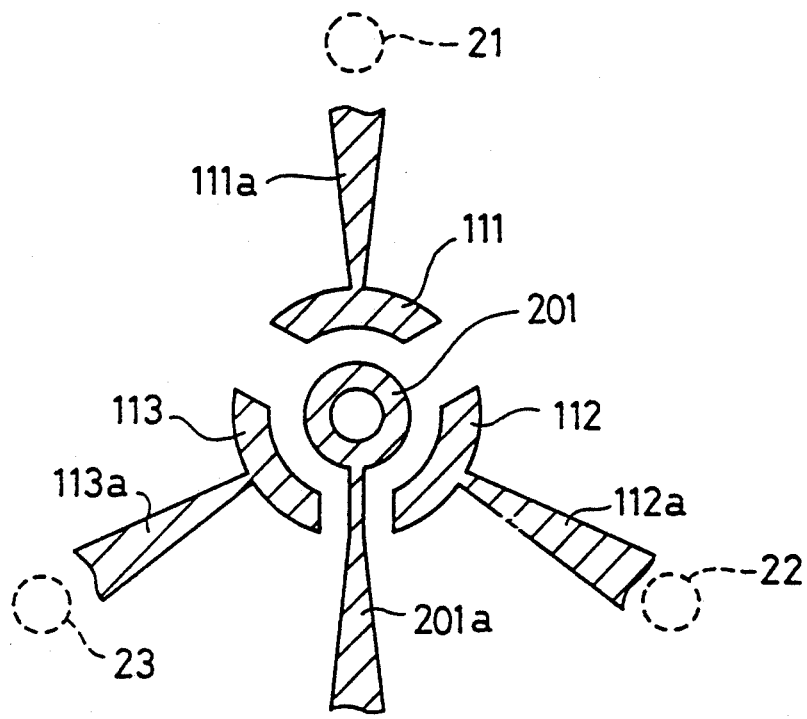
FIG. 15 is a view showing an arrangement of electrodes.

FIG. 15 is a bottom view showing the prism 41. A test electrode 201, and three electrodes 111 through 113 for adjusting parallelism are formed on the bottom face of the prism 41. Wires 201a, 111a, 112a, and 113a are respectively connected to the electrodes 201, 111, 112, and 113.

The piezoelectric actuators 21 through 23 are installed at the exterior of the electrodes 111 through 113 as shown by broken lines in FIG. 15. The piezoelectric actuators 21 through 23 are separately driven by the position controller 11 to adjust the parallelism of the surface of a semiconductor wafer 100 to the surface of the electrode 201. The parallelism is maintained by the three piezoelectric actuators 21 through 23, the position controller 11, the LCR meter 13, and the computer 14.

Figure 16:
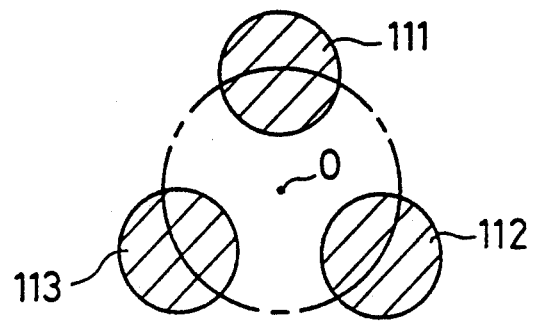
FIG. 16 is a view showing another arrangement of electrodes.

The electrodes 111 through 113 for adjusting parallelism are in the shape of identical arcs as seen in FIG. 15. Although circular electrodes 111 to 113 shown in FIG. 16 may also be used, the arc electrodes are preferable because of their area efficiency.

FIG. 17 shows the relationship between the inclination of the bottom surface of the prism 41 to the wafer and the capacity Ce of the electrodes 111, 112, and 113.

Figure 17A:
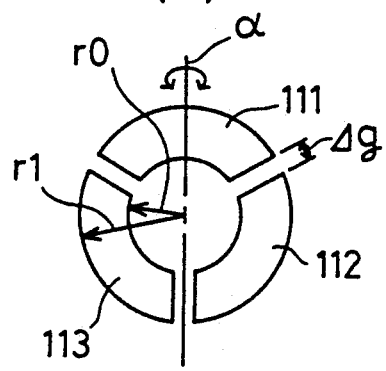
FIGS. 17 and 18 schematically illustrate the relationship between the slope of the bottom surface of the prism and the capacity of each electrode for parallelism adjustment.

The dimensions of the electrodes 111 through 113 in FIG. 17(a) are as follows:

Inner diameter r0=0.08 cm;
Outer diameter r1=0.12 cm; and
Space between electrodes Δg=0.07 cm.

Figure 17B:
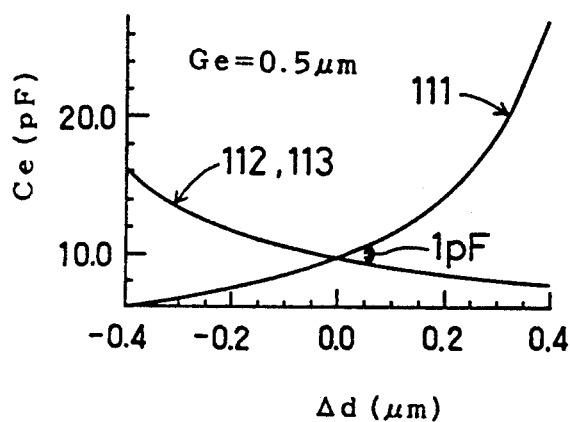

FIG. 17(b) shows the capacity Ce of the electrodes 111 through 113 plotted against the inclination of the bottom face of the prism 41 around an axis α of plane symmetry between the electrodes 112 and 113 shown in FIGS. 16(a) and 16(c).

Figure 17C:
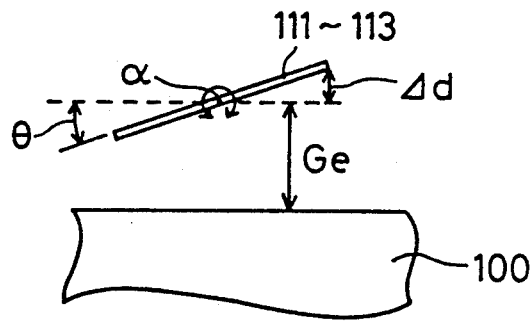

When the prism 41 is inclined by an angle θ, the electrodes 11 through 113 are no longer parallel with the surface of the semiconductor wafer 100, as shown in FIG. 17(c). The deviation Δd of the end of the electrodes 111, 112, and 113 from the parallel position is plotted as the abscissa in FIG. 17(b).

The capacity Ce of the electrodes 111 through 113 are measured with the LCR meter 13. The precision of capacity measurement with the LCR meter 13 and the computer 14 can be easily maintained as high as 0.1 pF. As shown in FIG. 17(b), when the precision of the measurement is 0.1 pF, the parallelism is adjusted to have the deviation Δd of at most 0.01 micrometer. When the deviation Δd is 0.01 micrometer, the angle of the inclination θ of the prism 41 is approximately 0.0005 degrees.

Figure 18A:
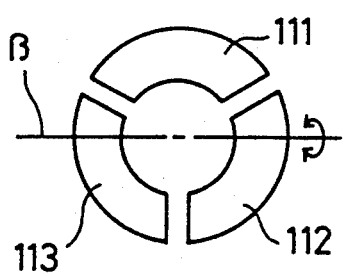
Figure 18B:
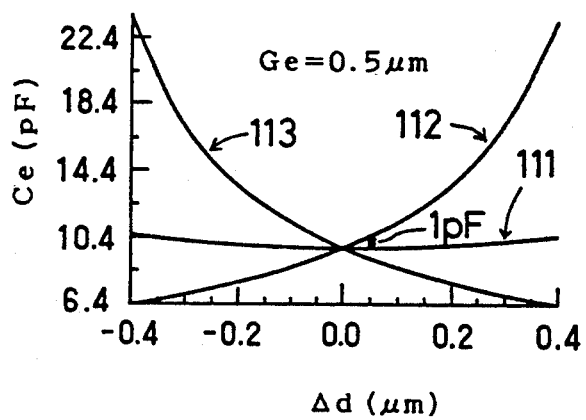

FIG. 18 shows the relationship between the deviation Δd and the capacity Ce of the electrodes 111 through 113, where the prism 41 is inclined around another axis β perpendicular to the axis α. When the precision of the measurement is 0.1 pF, the parallelism is also adjusted to have the deviation Δd of at most 0.01 micrometer as is the case with FIG. 17(b).

As described above, parallelism of the bottom of the prism 41 (and hence the surface of the test electrode 201) to the semiconductor wafer 100 is precisely adjusted by measuring the capacities of the three electrodes through 113 and by controlling the three piezoelectric actuators 21 through 23 to make the capacities equal to each other.

For adjusting parallelism, at least three electrodes are generally required. When the test electrode is an identical shape as the parallelism-adjusting electrodes, two parallelism-adjusting electrodes are sufficient because the test electrode is also used for adjusting parallelism.

Figure 19:
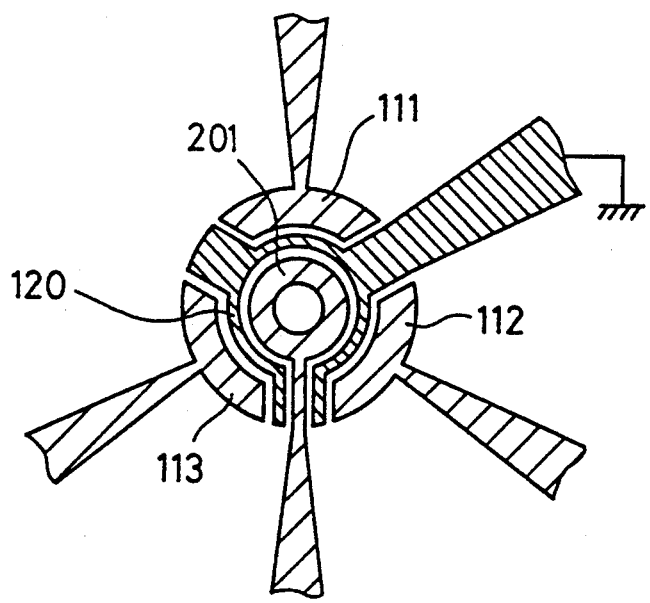
FIG. 19 is a view showing a further arrangement of electrodes.

The bottom of the prism 41 can be provided with a guard ring wire 120 as shown in FIG. 19. The guard ring wire 120 run between the spaces of the test electrode 201 and each parallelism-adjusting electrode 111, 112, or 113, and is maintained at a ground level. With the guard ring wire 120, the capacity of each electrode 111, 112, or 113 is measured without influences from the others and the parallelism is adjusted with higher precision.

Figure 20:
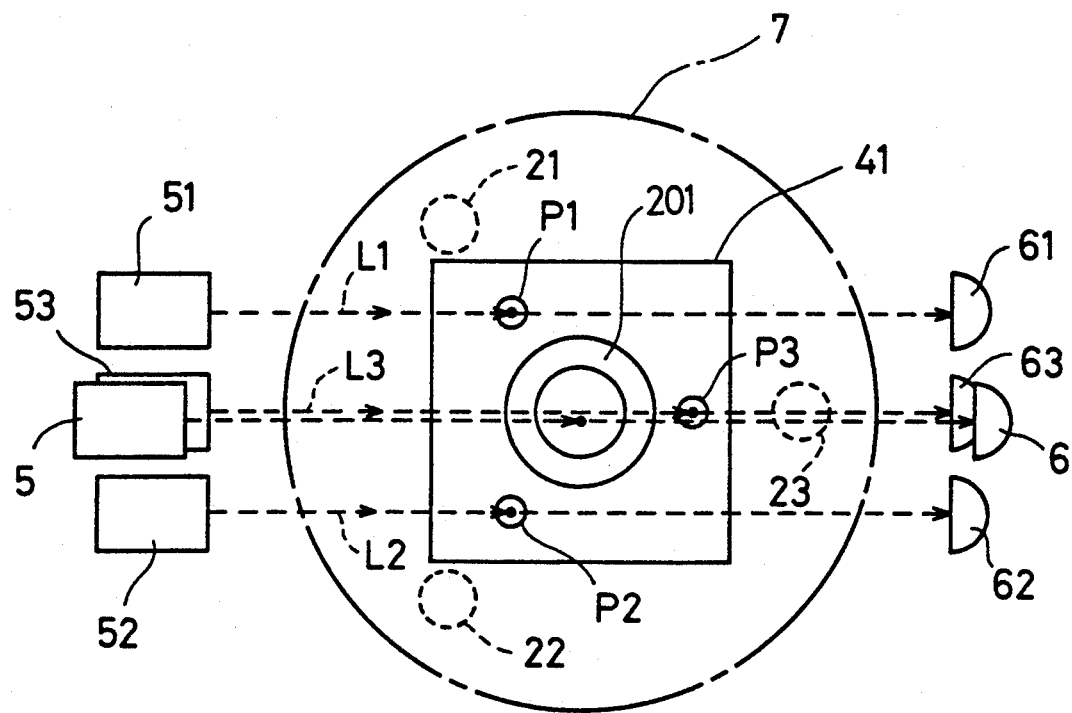
FIG. 20 is a bottom view illustrating a prism in a third embodiment.

Although the parallelism is adjusted based on the capacities of the three parallelism-adjusting electrodes in the second embodiment, the same can be accomplished by gap measurement employing a tunneling effect of a light wave. FIG. 20 is a bottom view of a prism 41 of such an apparatus shown as a third embodiment of the invention. The apparatus of the embodiment includes three laser sources 51 through 53 and three photosensors 61 through 63 for detecting parallelism besides the elements shown in FIG. 14.

Laser beams L1 through L3 emitted from the three laser sources 51 through 53 are reflected at reflecting points P1 through P3 on the bottom of the prism 41 and received by the photosensors 61 through 63, respectively. The reflecting points P1 through P3 are positioned on straight lines respectively connecting the center of the circular test electrode 201 with the piezoelectric actuators 21 through 23.

The gap G between each reflecting point P1, P2, or P3 on the bottom of the prism 41 and the surface of a semiconductor wafer is measured as described before. The parallelism is adjusted by controlling the piezoelectric actuators 21 through 23 in such a manner that the gaps G at the reflecting points P1 through P3 are equal to each other. Here the absolute value of the gap G at each reflecting point P1, P2, or P3 is not required, but the intensities of laser beams received by the photosensors 61 through 63 is equalized for parallelism adjustment.

A beam splitter can be used to divide one laser beam emitted from the laser source 5 into three beams instead of the plural laser sources 51 through 53 for parallelism adjustment.

Three laser beams are generally required for parallelism adjustment; but one beam can also be used for gap measurement. In the latter case, three photosensors are sufficient instead of the four as shown in FIG. 20.

The invention is not limited to the above embodiments but there may be many other modifications and changes without departing from the scope of the invention. Some examples of such modifications are shown below.

(1) The present invention is applicable to measurement of electric characteristics between a test electrode and a semiconductor substrate other than the C-V curve measurement.

For example, characteristics of the surface area of a semiconductor can be evaluated based on the time dependence of the resultant capacity Cta.

Interface charges and surface-state at the boundary between the semiconductor substrate 101 and the oxide film 102 can be evaluated by measuring the conductance with the LCR meter 13.

Furthermore, the cleaning process of semiconductor wafers, heat oxidation, and stabilizing heat treatment of oxidation films can be evaluated according to the present invention by measuring C-V curves of semiconductor wafers, even if an oxide film is not formed on the wafers.

(2) Although laser beams are used for gap measurement and parallelism adjustment in the above embodiments, any monochromatic light can be used instead. Monochromatic light gives constant optical factors (refractive index and absorption factor) to a substance, and thereby transmittance and reflectance are easily calculated. Monochromatic light of a long wavelength can be used instead of laser beams for precisely measuring gaps of greater than 1 micrometer.

An example of such monochromatic light of a long wavelength is obtained by passing a far infrared ray, emitted from a globar light source (that is, silicon carbide (SiC) bar), through a band pass filter. Polarized light of a long wavelength is also obtained by using a polarization plate.

According to the present invention, electric characteristics are measured between a semiconductor substrate and a test electrode, which is held above the surface of a semiconductor wafer across a gap. Namely, electric characteristics of a semiconductor wafer are detected without forming a test electrode on the surface of the semiconductor wafer.

The size of a gap maintained by the electrode supporting unit 300 is accurately and precisely measured by a method employing the tunneling effect. Accordingly, an apparatus embodying the present invention detects an electrostatic capacity of the gap and thereby electric characteristics of a semiconductor wafer at high precision.

Using the parallelism adjustment, by comparing electrostatic capacities between plural parallelism-adjusting electrodes and the semiconductor wafer, further improves the precision in measuring an electrostatic capacity of the gap and thereby electric characteristics of a semiconductor wafer. Alternatively, the parallelism can be adjusted by comparing the intensities of monochromatic light detected by plural photosensors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for measuring an electric characteristic of a semiconductor wafer, the apparatus comprising:
   an electrode supporting means for supporting a test electrode at a location removed from a surface of said semi-conductor wafer so that said test electrode is separated from said surface of said semiconductor wafer by a gap;
   means for supporting said semiconductor wafer adjacent said test electrode;
   gap measuring means coupled to said electrode supporting means for measuring said gap between said test electrode and said surface of the semiconductor wafer; and
   characteristic measuring means coupled to said test electrode and to said means for supporting said semiconductor wafer for measuring an electric characteristic between said test electrode and said semiconductor wafer;
   said electrode supporting means further comprising a positioning means for positioning said test electrode in a desired position;
   said gap measuring means including a light transmission means for emitting and measuring, after reflection at a reflecting surface substantially parallel to the surface of said wafer, the intensity of a monochromatic light; and further including:
   a position controller for controlling said positioning means.

2. An apparatus in accordance with claim 1, wherein said light transmission means is mounted on said electrode supporting means said light transmission means comprising:
   a light source for emitting monochromatic light;
   a light transmission reflector having a reflecting surface located substantially parallel to said surface of said semiconductor wafer for reflecting said monochromatic light at said reflecting surface such that geometric optical total reflection occurs, wherein said test electrode is attached to said reflecting surface holding said test electrode; and
   a photosensor for measuring intensity of said monochromatic light reflected by said reflecting surface.

3. An apparatus in accordance with claim 2, wherein said positioning means comprises:
   a plurality of parallelism-adjusting electrodes formed on said reflecting surface; and
   parallelism adjusting means for measuring an electrostatic capacity between said semiconductor wafer and each of said parallelism-adjusting electrodes, said parallelism adjusting means relatively adjusting the plane of said reflecting surface to be substantially parallel to said surface of said semiconductor wafer on the basis of comparison among the measured electrostatic capacities.

4. An apparatus in accordance with claim 3, wherein:
   said gap measuring means comprises means for comparing said intensity of said reflected monochromatic light with a calculated value of said intensity according to Maxwell's equations relating to a condition of total reflection with respect to said gap, thereby measuring said gap.

5. An apparatus in accordance with claim 4, wherein said monochromatic light is a laser beam.

6. An apparatus in accordance with claim 1, wherein said positioning means comprises:
   a base;
   a piezoelectric actuator attached to said base; and
   a stand attached to said piezoelectric actuator, wherein said piezoelectric actuator is extensible and retractable and effective for moving said stand in response to voltage supplied by said position controller.

7. An apparatus in accordance with claim 2, wherein said gap measuring means measures said gap as a function of the intensity of said reflected monochromatic light.

8. An apparatus in accordance with claim 4, wherein said gap is less than 1 micrometer.

9. An apparatus in accordance with claim 5, further comprising:
   a suction pump; and
   a conductive suction table;
   wherein said semiconductor wafer is fixed to said conductive suction table by suction from said suction pump; and
   wherein said measuring means comprises means for measuring an electric characteristic between said test electrode and said conductive suction table to determine said electric characteristic between said test electrode and said semiconductor wafer.

10. An apparatus in accordance with claim 1, wherein:
    said electric characteristic is a function of a dependance of an electrostatic capacity on a voltage between said test electrode and a substrate of said semiconductor wafer.

11. An apparatus in accordance with claim 2, wherein said positioning means further comprises:
    light emitting means for emitting a plurality of monochromatic light beams incident on said reflecting surface;
    a plurality of photosensors for measuring the intensities of the plurality of reflected beams of said plurality of monochromatic light beams reflected by said reflecting surface; and
    parallelism relatively adjusting means for adjusting the plane of said reflecting surface to be substantially parallel to said surface of said semiconductor wafer on the basis of comparison among the intensities of said plurality of reflected beams.

12. An apparatus in accordance with claim 11, wherein said gap measuring means comprises means for comparing said intensity of said reflected monochromatic light with a calculated value of said intensity according to Maxwell's equations relating to a condition of total reflection with respect to said gap, thereby measuring said gap.

13. An apparatus in accordance with claim 12, wherein said monochromatic light is a laser beam.

14. An apparatus in accordance with claim 12, wherein said gap is less than 1 micrometer.

15. An apparatus in accordance with claim 13, further comprising:
    a suction pump; and
    a conductive suction table;
    wherein said semiconductor wafer is fixed to said conductive suction table by suction from said suction pump; and
    wherein said gap measuring means comprises means for measuring an electric characteristic between said test electrode and said conductive suction table to determine said electric characteristic between said test electrode and said semiconductor wafer.

16. An apparatus in accordance with claim 15, wherein:
    said electric characteristic between said test electrode and said semiconductor wafer is a function of a dependance of an electrostatic capacity on a voltage between said test electrode and a substrate of said semiconductor wafer.

17. A method of measuring an electric characteristic of a semiconductor wafer, comprising the steps of:
    preparing a test electrode and a semiconductor wafer;
    supporting said test electrode;
    supporting the semiconductor wafer opposite said test electrode;
    measuring a gap between said test electrode and the surface of the semiconductor wafer;
    coupling a measuring means between said test electrode and a support surface for said semiconductor wafer; and
    measuring an electric characteristic between said test electrode and said semiconductor wafer; and
    wherein said measuring of said gap step comprises the steps of:
    positioning said test electrode in a desired position with a positioning means;
    emitting and measuring after reflection at a reflecting surface substantially parallel to the surface of the wafer, the intensity of a monochromatic light; and
    controlling the positioning of said test electrode.

18. A method in accordance with claim 17, wherein said emitting and measuring step comprises the steps of:
    emitting monochromatic light incident on a reflecting surface of a light transmission reflector, said reflecting surface being located substantially parallel to said surface of said semiconductor wafer, said test electrode being attached to said reflecting surface;
    reflecting said monochromatic light at said reflecting surface such that geometric optical total reflection occurs;
    measuring intensity of said monochromatic light reflected by said reflecting surface; and
    measuring said gap as a function of said intensity of said reflected monochromatic light.

19. A method in accordance with claim 18, further comprising, before said supporting step, the steps of:
    preparing a plurality of parallelism-adjusting electrodes, said electrodes being formed on said reflecting surface;
    measuring an electrostatic capacity between said semiconductor wafer and each of said plurality of parallelism-adjusting electrodes; and
    relatively adjusting the plane of said reflecting surface to be substantially parallel to the surface of said semiconductor wafer on the basis of comparison among the measured electrostatic capacities.

20. A method in accordance with claim 19, wherein said gap measuring step comprises the step of:
    comparing said intensity of said reflected monochromatic light with a calculated value of said intensity according to Maxwell's equations relating to a condition of total reflection with respect to said gap, thereby measuring said gap.

21. A method in accordance with claim 20, wherein said step of emitting monochromatic light comprises the step of emitting a laser beam.

22. A method in accordance with claim 21, wherein said electric characteristic is a function of a dependance of an electrostatic capacity on a voltage between said test electrode and a substrate of said semiconductor wafer.

23. A method in accordance with claim 20, wherein said gap is less than 1 micrometer.

24. A method in accordance with claim 18, further comprising, before said supporting step, the steps of:
    emitting a plurality of monochromatic light beams incident on said reflecting surface;
    measuring the intensities of the plurality of reflected beams of said plurality of monochromatic light beams reflected by said reflecting surface; and
    relatively adjusting the plane of said reflecting surface to be substantially parallel to the surface of said semiconductor wafer on the basis of comparison among the intensities of said plurality of reflected beams.

25. A method in accordance with claim 24, wherein said gap measuring step comprises the step of:
    comparing said intensity of said reflected monochromatic light with a calculated value of said intensity according to Maxwell's equations relating to a condition of total reflection with respect to said gap, thereby measuring said gap.

26. A method in accordance with claim 25, wherein said step of emitting monochromatic light comprises the step of emitting a laser beam.

27. A method in accordance with claim 25, wherein said gap is less than 1 micrometer.

* * * * *